United States Patent [19]
Arai et al.

[11] Patent Number: 5,565,691
[45] Date of Patent: Oct. 15, 1996

[54] THIN FILM SEMICONDUCTOR SYSTEM

[75] Inventors: Michio Arai, Tokyo; Isamu Kobori, Kanagawa, both of Japan

[73] Assignees: TDK Corporation, Tokyo; Semiconductor Energy Laboratory Co., Ltd., Kanagawa, both of Japan

[21] Appl. No.: 451,752

[22] Filed: May 26, 1995

Related U.S. Application Data

[62] Division of Ser. No. 361,366, Dec. 22, 1994.

[30] Foreign Application Priority Data

Dec. 22, 1993 [JP] Japan ................................ 5-323909

[51] Int. Cl.$^6$ ........................ H01L 29/78; H01L 27/12; H01L 29/36
[52] U.S. Cl. ................ 257/66; 257/56; 257/58; 257/62; 257/65; 257/410
[58] Field of Search ............................. 257/410, 56, 58, 257/65, 62

[56] References Cited

U.S. PATENT DOCUMENTS

| | | | |
|---|---|---|---|
| 4,007,294 | 2/1977 | Woods et al. | 257/410 |
| 4,027,380 | 6/1977 | Deal et al. | 257/655 |
| 4,625,224 | 11/1986 | Nakagawa et al. | 257/66 |

*Primary Examiner*—Robert P. Limanek
*Assistant Examiner*—David B. Hardy
*Attorney, Agent, or Firm*—Nikaido, Marmelstein, Murray & Oram LLP

[57] ABSTRACT

In a thin film semiconductor device having a substrate (1), an active layer (3, 6, 9), a gate insulation layer (4), and a gate electrode (5), the active layer is produced through the steps of producing an amorphous silicon layer on said substrate through a CVD process by using polysilane $Si_nH_{2(n+1)}$, n is an integer, with added chlorine gas, and effecting solid phase growth on to said amorphous silicon layer. The addition of chlorine in producing the amorphous silicon layer makes it possible to produce the amorphous silicon layer at a lower temperature and at a rapid growth rate. A thin film semiconductor device thus produced has the advantages of high mobility and low threshold voltage.

9 Claims, 7 Drawing Sheets

THIN FILM SEMICONDUCTOR SYSTEM

This is a division, of application Ser. No. 08/361,366 filed Dec. 22, 1994.

BACKGROUND OF THE INVENTION

The present invention relates to a method for producing a thin film semiconductor device, and a device produced by said method. In particular, it relates to such a method and a device in which an amorphous silicon layer is subject to crystallization through an annealing process at lower temperature and higher growth rate than was previously practiced.

Conventionally, a polysilicon layer for a thin film transistor is produced through the steps of disposing an amorphous silicon layer on a substrate, and crystallizing said layer through a laser annealing process or a thermal solid phase growth process. The characteristics of a crystallized polysilicon layer thus produced depend upon the method for producing said amorphous silicon layer.

Conventionally, an amorphous silicon layer is produced through a low pressure CVD process (LPCVD) or a plasma CVD process (P-CVD) with a raw material of $SiH_4$, or $Si_2H_6$. The characteristics of a thin film transistor using said amorphous silicon layer, or the mobility in the layer, are better when the amorphous silicon layer is produced at lower temperature, and at higher growth rate or speed of making the layer.

In comparing P-CVD with LPCVD, a P-CVD process has the disadvantage, as compared with LPCVD process, in that the former includes impurities, like oxygen, in the amorphous layer due to activation, by means of a gas including oxygen, in the reaction chamber. The former process produces an amorphous layer at lower temperature than the latter process, and therefore, it is impossible for a P-CVD process to provide a product having better characteristics than are produced by the LPCVD process (IEEE ELECTRON DEVICE LETTERS, VOL. 12, No.7, Jul. 1991 ). Further, since the process shown in that article uses high pressure oxygen to provide an oxidized layer on an amorphous silicon layer to be used as gate insulation layer, it would be possible that the layer includes more undesired oxygen.

As another prior art, JP laid open 66919/1988 patent shows a process for producing an amorphous layer by using $Si_2Cl_6+SiH_4$, or $Si_2Cl_6+Si_2H_6$. However, the process is not a mere thermal dissolution process, but an optical dissolution process and/or a plasma dissolution process, and therefore, the apparatus used to produce the amorphous layer is complicated, and producing cost would be high. The quality of a layer produced through said process is not shown in that publication.

Said optical dissolution process has the disadvantage that producing efficiency is low since only one substrate is placed in a vertical direction on a board holder in a heater, since the amorphous silicon layer is produced only on that portion of a substrate where light illuminates it.

Said plasma dissolution process also has the disadvantage that producing efficiency is low since only one substrate at a time is placed in a vertical direction on a board holder in a heater. Further, since the chamber must be conductive for applying voltage for producing plasma, and it is actually made of stainless steel, metal pollution is inevitable, and still further, since the gas material has an undesired etching capability, it is difficult to produce a good amorphous silicon layer through said process.

SUMMARY OF THE INVENTION

It is an object, therefore, of the present invention to overcome the disadvantages and limitations of a prior art processes for producing a thin film semiconductor device by providing a new and improved process for producing a thin film semiconductor device.

It is also an object of the present invention to provide a method for producing a thin film semiconductor device by using a non-conductive chamber.

It is also an object of the present invention to provide a method for producing a thin film semiconductor device by using a quartz crystal chamber.

Another object of the present invention is to provide a method for producing a thin film semiconductor device with high production efficiency, and excellent characteristics.

Another object of the present invention is to provide a semiconductor device produced by said method, which has excellent characteristics, in particular high mobility and low threshold voltage.

The above and other objects are attained by a method for producing a thin film semiconductor device comprising the steps of producing an amorphous silicon layer on a substrate through a CVD process with poly silane $Si_nH_{2(n+1)}$, where n is an integer, having chlorine $Cl_2$ added thereto, and effecting solid phase growth on to said amorphous silicon layer to provide an active silicon layer.

A semiconductor device thus produced has an active silicon layer including chlorine at a concentration in the range from $2\times10^{17}/cm^3$ to $5\times10^{21}$ atom/$cm^3$, and has high mobility and low threshold voltage.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
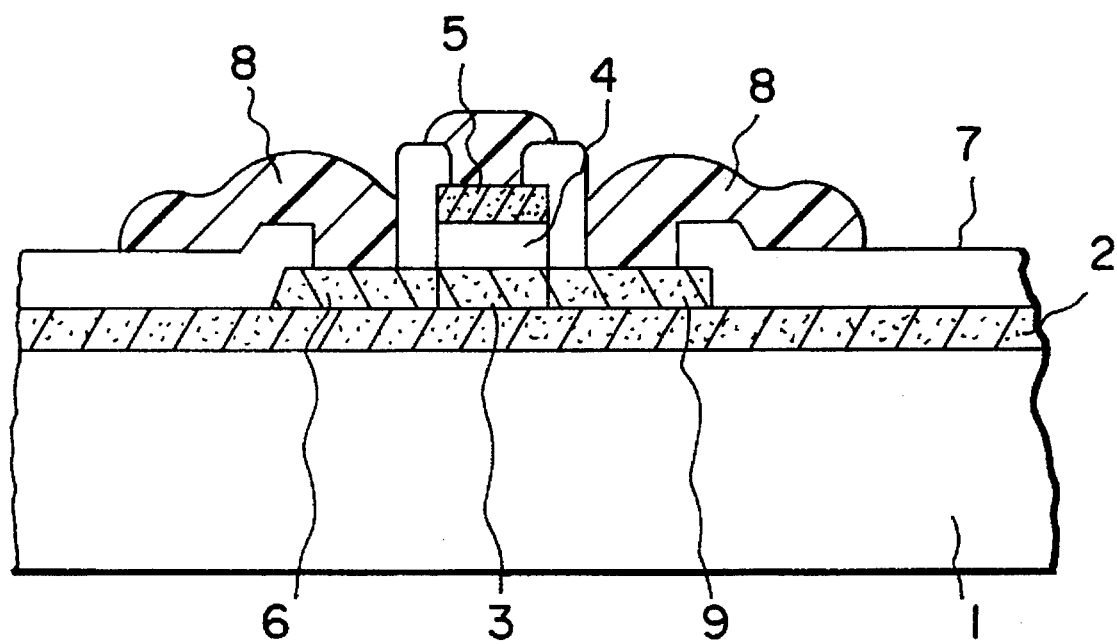
FIG. 1 shows a cross section of a thin film semiconductor device produced through the present invention.

FIG. 1 shows a cross section of a thin film semiconductor device according to the present invention. In the figure, the numeral 1 is a substrate, on which an insulation layer 2 made of $SiO_2$ is placed. Then, on said insulation layer 2, an amorphous silicon layer 3 is produced through a CVD (chemical vapor deposition) process using polysilane $Si_nH_{2(n+1)}$ (n is an integer) and chlorine ($Cl_2$). Then, a gate insulation layer 4 is produced on said amorphous silicon layer 3. Also, said amorphous silicon layer 3 is solid phase grown or activated so that a crystallized active silicon layer is obtained. A silicon layer 5 is deposited on the gate insulation layer 4 as a gate electrode. The numerals 6 and 9 show a source region and a drain region, 7 is an interinsulator, and 8 is a doped silicon layer which is used for an electrode.

Figure 2:
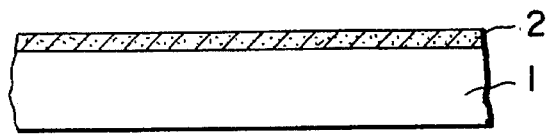
FIG. 2 shows the steps of producing a thin film semiconductor device according to the present invention.
Figure 2:
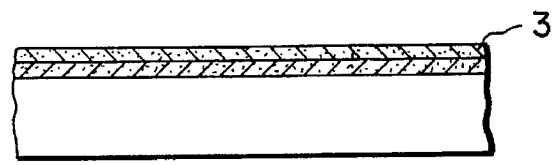
Figure 2:
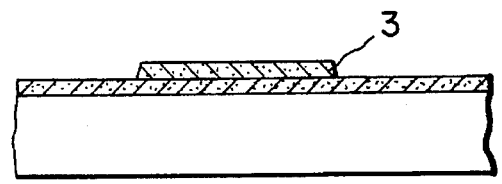
Figure 2:
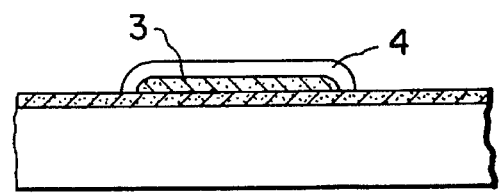
Figure 2:
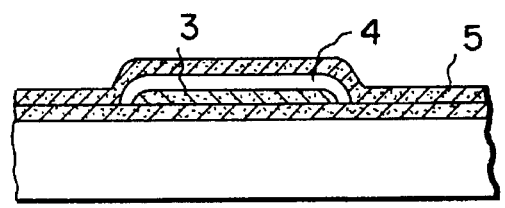
Figure 2:
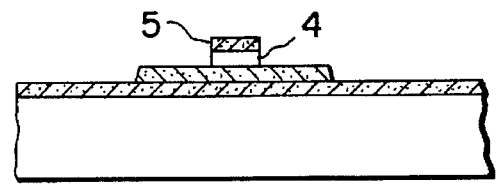
Figure 2:
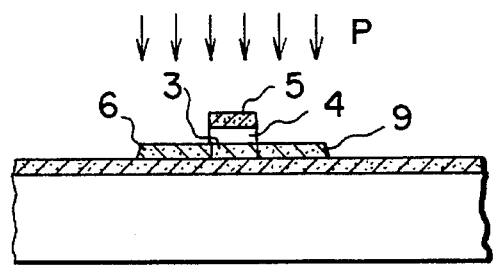
Figure 2:
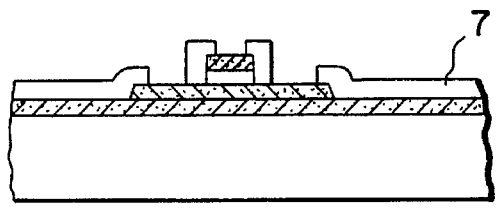

The steps for producing the present thin film semiconductor device are described with reference to FIG. 2.

(1) A substrate 1, made of glass for instance, it is commercially obtained under the trade name 7059 supplied by Coming Co. Ltd. in U.S.A.. An insulation layer 2, made of $Sio_2$, is placed on the substrate through a sputter process in a thickness of 1000 Å (FIG. 2(A)).

(2) An amorphous silicon layer 3 is deposited on said insulation layer 2 in a thickness of about 2000 Å through a CVD process (FIG. 2(B)).

The process conditions of said CVD process are as follows.

| $SiH_4$ gas | 100 SCCM (Standard Cubic Centimeter per Minute) |
| --- | --- |
| Pressure | 0.3 Torr |
| $Cl_2$ gas | 1–90 SCCM |
| Temperature | 550° C. |
| Growth rate | 100 Å/minute |

It should be noted that the process temperature (550° C.) is lower than that of a prior art, and that the growth rate is higher than in the prior art.

(3) Then, said amorphous silicon layer 3 is patterned to provide an island (Fig. 2(C)).

(4) A gate insulation layer 4 is produced on said amorphous silicon layer 3 by oxidizing a part of said amorphous silicon layer 3 (FIG. 2(D)).

The process conditions for depositing said gate insulation layer 4 are as follows.

| $H_2$ gas | 4 SLM (Standard Liter per Minute) |
| --- | --- |
| $O_2$ gas | 10 SLM |
| Temperature | 600° C. |
| Process time | 5 hours |

(5) After said gate insulation layer 4 is produced, a solid phase growth process is carried out for producing said amorphous silicon layer 3 so that said layer 3 is crystallized, or activated.

The process conditions for the solid phase growth are as follows.

| $N_2$ gas | 1 SLM |
| --- | --- |
| Temperature | 600° C. |
| Process | 5 hours–20 hours |

It should be noted that the processing time is rather short, as compared to the previous process (4) because this prior process provided a gate insulation layer as well as contributing to solid phase growth. Thus, an amorphous silicon layer 3 is converted to an active crystallized silicon layer.

(6) After a gate insulation layer is produced, and a solid phase growth is carried out, a gate electrode made of a silicon layer 5 is placed on said gate insulation layer 4 through a low pressure CVD process in a thickness about 2000 Å (FIG. 2(E)). The process conditions in this case are similar to those of the process (2). A dopant like phosphorous may be added while producing the layer 5.

(7) Then, a gate electrode 5 and a gate insulation layer 4 are patterned through an etching process according to a predetermined pattern (FIG. 2(F)).

(8) Then, a dopant, for instance phosphorous, is doped into suitable regions, to form a drain and a source region of a transistor, with a mask relative to said gate electrode 5 through an ion doping process so that a source region 6 and a drain region 9 are self aligned with the gate electrode (FIG. 2(G)).

(9) Then, said dopant is activated by heating the whole body thus obtained at about 550° C. for about 5 hours in an atmosphere of nitrogen.. Then, the whole body is heated in an atmosphere of hydrogen at about 400° C. for 30 minutes for hydrogenation and decreasing trap density of the semiconductor layer.

(10) Then, an inter layer insulation layer 7 of $SiO_2$ is placed on the whole body by using TEOS (tetraethoxy Silane)in a thickness about 4000 Å.

The conditions of producing said $SiO_2$ layer are as follows.

| TEOS gas | 10–50 SCCM |
| --- | --- |
| $O_2$ gas | 500 SCCM |
| Power | 50–300 watts |
| Temperature | 400° C. |

After said $SiO_2$ layer is produced, a patterning process is carried out to produce the necessary shape of wiring for the electrodes, and an inter layer insulation layer 7 (FIG. 2(H)).

(11) Next, another doped silicon layer 8 is produced for an electrode, which is patterned. Thus, a thin film transistor as shown in FIG. 1 is obtained.

In the above step (8), a dopant, phosphorous for an N type transistor, may be replaced by boron for a P type transistor.

The important feature of the present invention is to produce an amorphous silicon layer through a CVD process using polysilane $Si_nH_{2(n+1)}$ (n is an integer) with added chlorine ($Cl_2$), as mentioned in said process (2).

The use of chlorine improves the process so that it can be carried out at lower temperature and at a higher growth rate.

Figure 3:
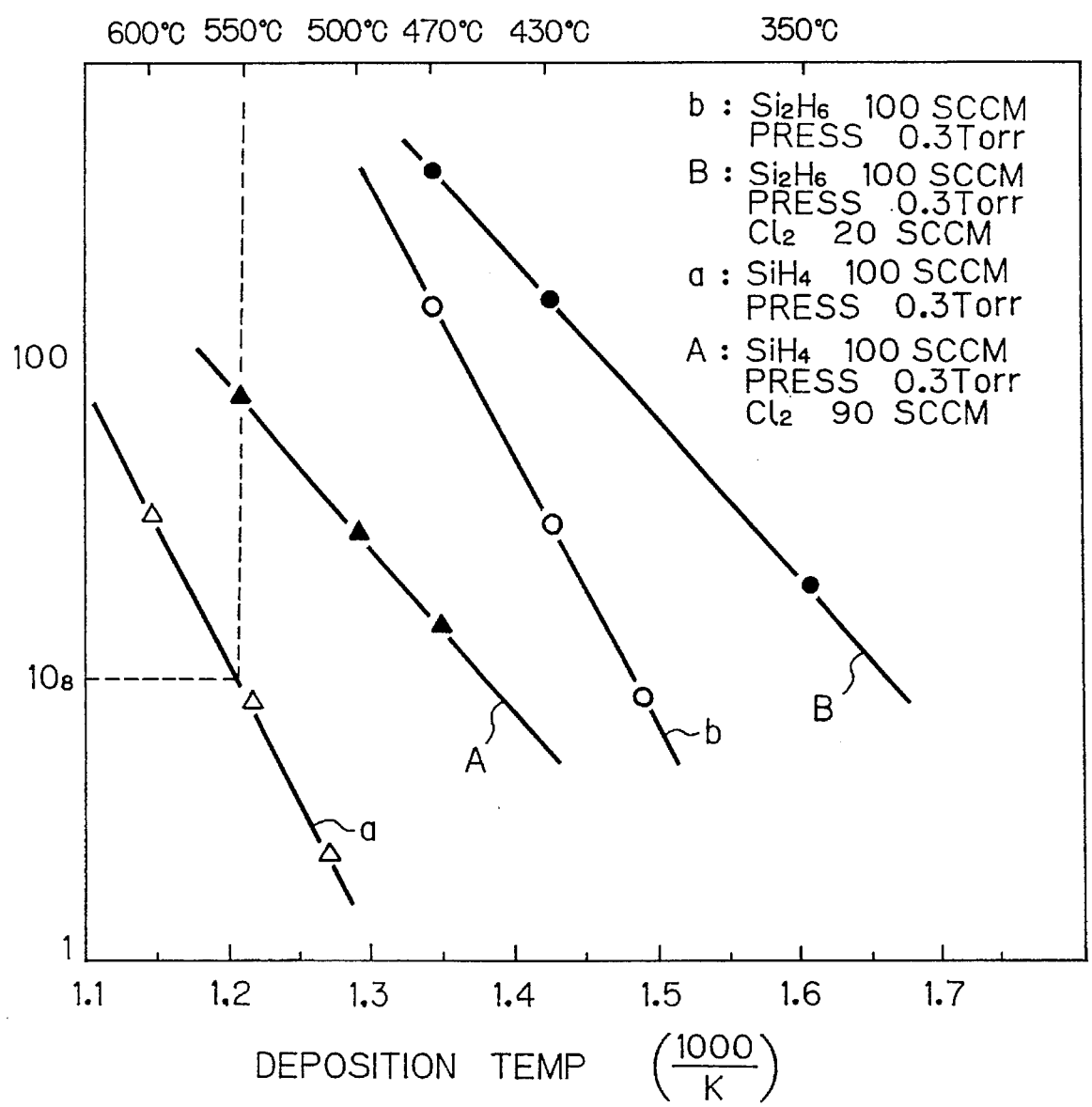
FIG. 3 shows curves comparing deposition temperature and growth rate of an amorphous silicon layer.

FIG. 3 shows curves relating deposition temperature (horizontal axis) and growth rate of an amorphous silicon layer, in logarithm scale, in Å/minute. On the horizontal axis, the bottom legend indicates 1000/K, where K is the absolute temperature, and the upper legend indicates °C.

In FIG. 3, the curve (a) shows the case where an amorphous silicon layer is produced under the condition that the gas is $SiH_4$ with flow rate 100 SCCM with no addition of $Cl_2$ gas, and the pressure is 0.3 Torr. The curve (A) shows the case where chlorine ($Cl_2$) gas at a flow rate of 90 SCCM is added to the condition in the curve (a). The curve (b) shows the case where an amorphous silicon layer is produced under the condition that the gas is $Si_2H_6$ at a flow rate of 100 SCCM with no addition of $Cl_2$ gas, and the pressure is 0.3 Torr. The curve (B) shows the case where chlorine ($Cl_2$) gas, at a flow rate of 20 SCCM, is added to produce the curve (b).

In comparing the curve (a) with the curve (A), the growth rate in case of only $SiH_4$ gas is 8 Å/minute, at 550° C. (curve (a)), while the growth rate when chlorine gas is added is 100 Å/minute at the same temperature (curve (A)).

Similarly, in comparing the curve (b) with the curve (B) the growth rate in case of only $Si_2H_6$ is 20 Å/minute at 450° C., while the growth rate when chlorine gas is added is 130 Å/minute at the same temperature (curve (B)). Further, at 350° C., the curve (b) shows that no growth of amorphous silicon layer is possible, while the curve (B) shows that the growth is possible at a growth rate of 13 Å/minute.

Figure 4:
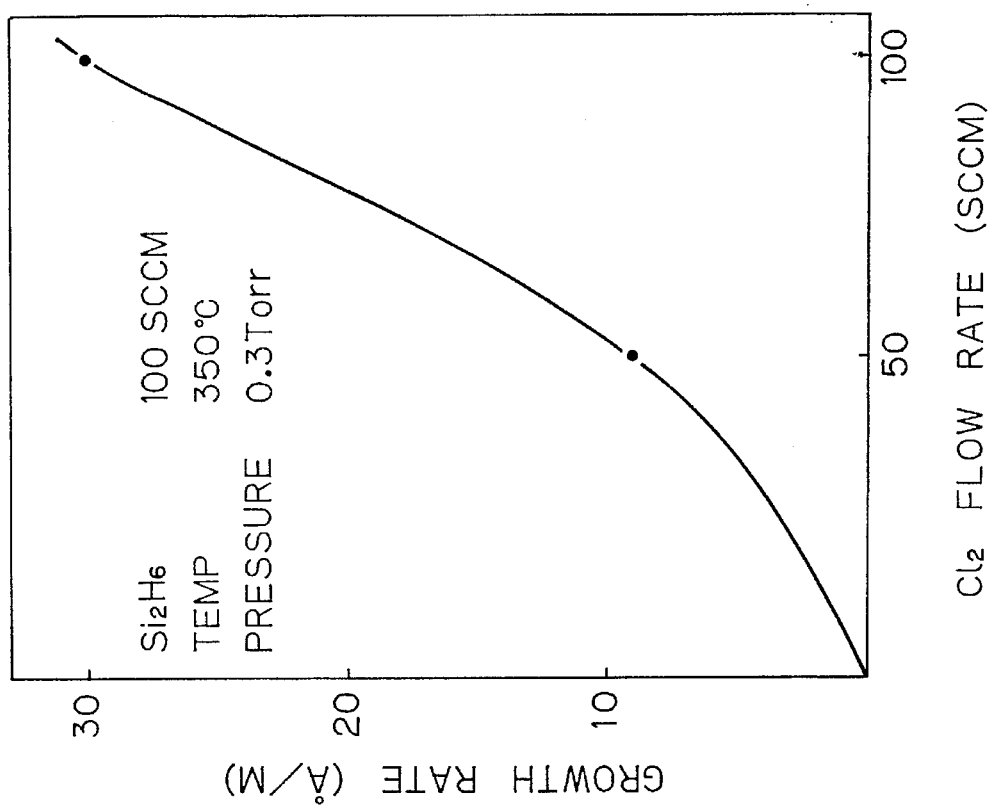
FIG. 4 shows curves comparing flow rate of chlorine and growth rate of an amorphous silicon layer.
Figure 4:
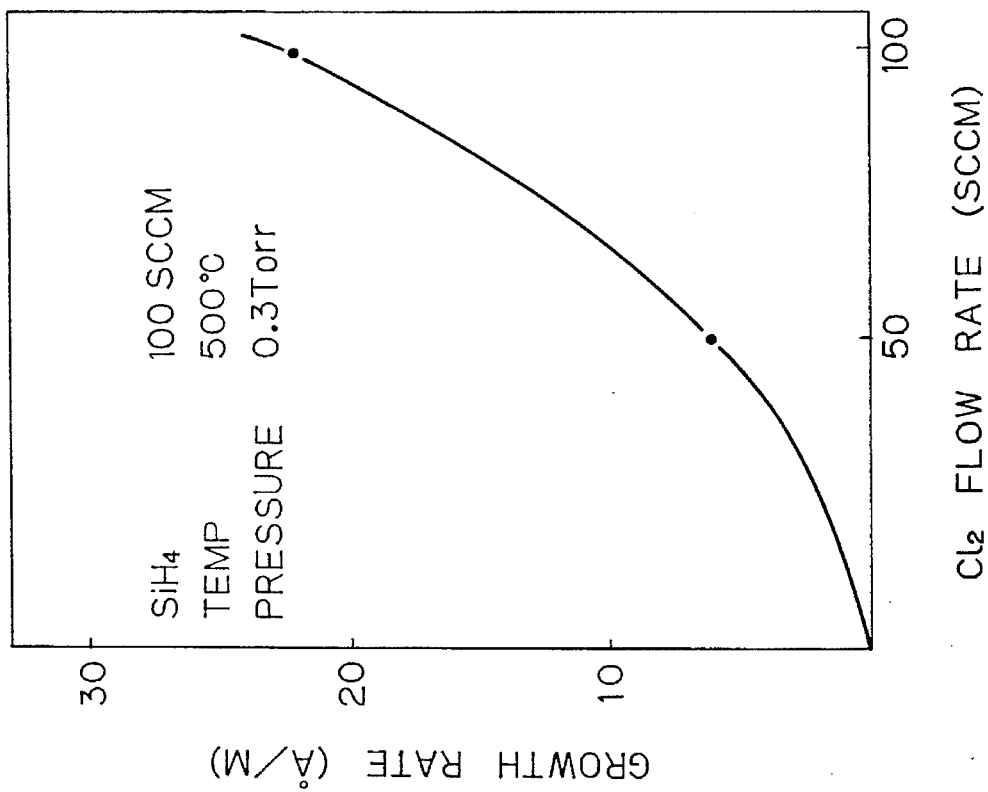

FIG. 4 (a) shows the curve relating the flow rate of chlorine gas (horizontal axis) and the growth rate (vertical axis), under the condition that $SiH_4$ gas is used at a flow rate of 100 SCCM, a temperature of 500° C. and a pressure of 0.3 Torr.

FIG. 4(b) shows the curve relating the flow rate of chlorine gas (horizontal axis) and the growth rate (vertical axis), under the condition that $Si_2H_6$ gas is used at a flow rate of 100 SCCM, a temperature of 350° C. and a pressure of 0.3 Torr.

It should be appreciated in FIG. 4 that the growth rate is increased as the flow rate of chlorine gas is increased. The ratio of increase of the growth rate by adding chlorine can be up to 50–60 times higher at low temperature as shown in FIGS. 3 and 4.

Figure 5:
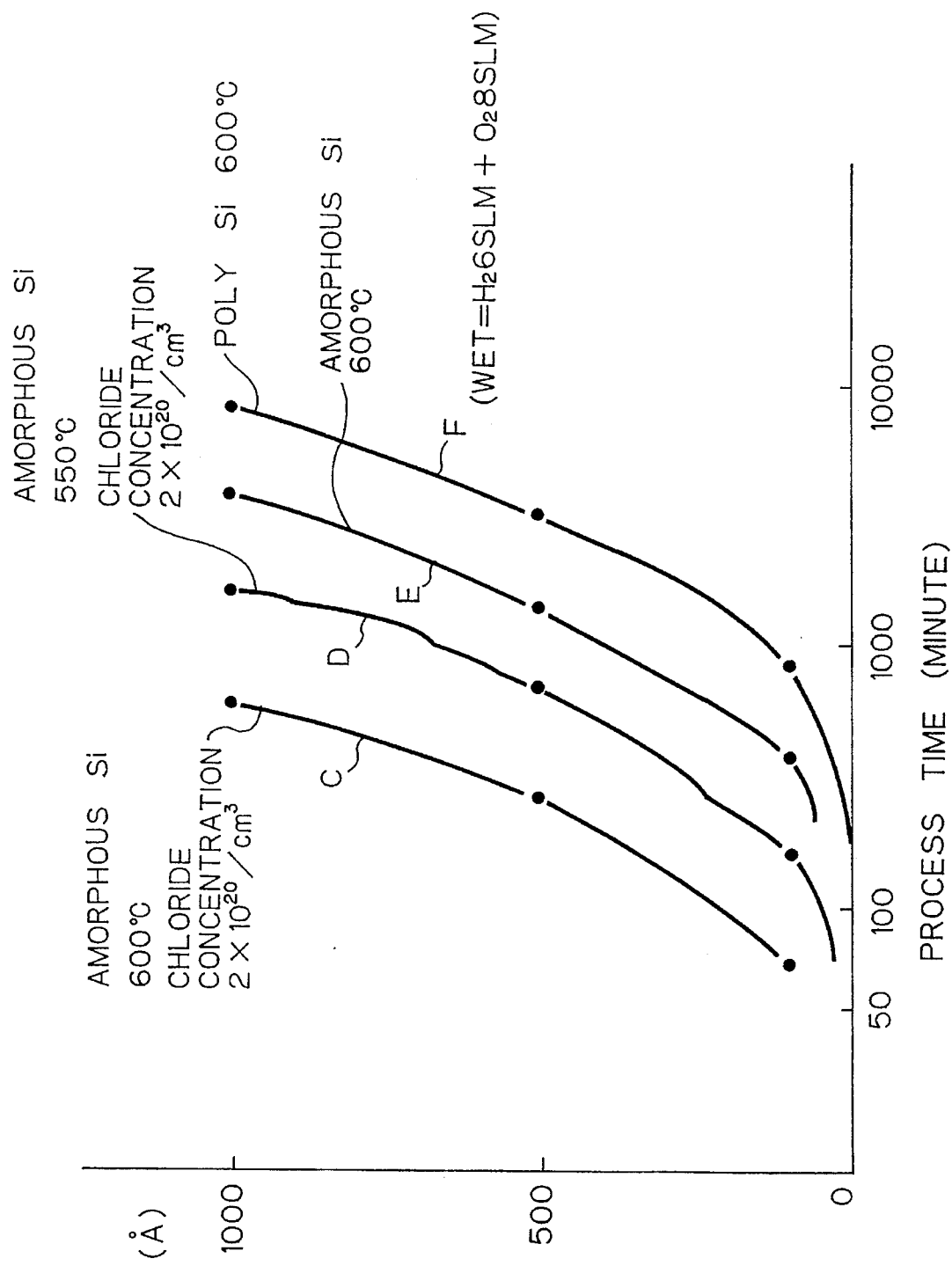
FIG. 5 shows curves comparing process time for producing a gate insulation layer and thickness of the produced gate insulation layer.

FIG. 5 shows the curves relating the effect of the presence of chlorine when a gate insulation layer is produced in a wet atmosphere with $H_2$ at 6 SLM and $O_2$ at 8 SLM. In FIG. 5, the horizontal axis shows the process time in minutes and the vertical axis shows the produced thickness in Å of a gate insulation film.

The curve (C) in FIG. 5 shows the case where the concentration of chlorine in the amorphous silicon layer is $2\times10^{20}/cm^3$, and the temperature is 600° C. The curve (D) shows the case that the concentration of chlorine in the amorphous silicon layer is $2\times10^{20}/cm^3$ and the temperature os 550° C. The curve (E) shows the case where no chlorine is included in the amorphous silicon layer and the temperature is 600° C., and the curve (F) shows the case where no chlorine is included in the poly silicon layer and the temperature is 600° C.

It should be appreciated, from considering FIG. 5, that the addition of chlorine makes it possible to produce a gate insulation layer at a low temperature of 550° C., and further, shortens the process time considerably as compared with the time of the process shown in relation to the curves (E) and (F). Further, it is observed that threshold voltage of the gate insulation layer is 7 MV/cm, (Mega Volt), which is quite high, and the surface state density is $5\times10^{10}/cm^2$ which is small enough.

In a conventional gate insulation layer produced through a CVD process or a sputter process, it is impossible to produce an excellent surface state density since natural oxide exists on the surface of an active silicon layer. The present invention using thermal oxidation for a gate insulation layer improves said problem. Further, as the thermal process for a gate insulation layer also serves as the process for solid phase growth, the thermal process for producing a gate insulation layer shortens the process time for the solid phase growth.

Figure 6:
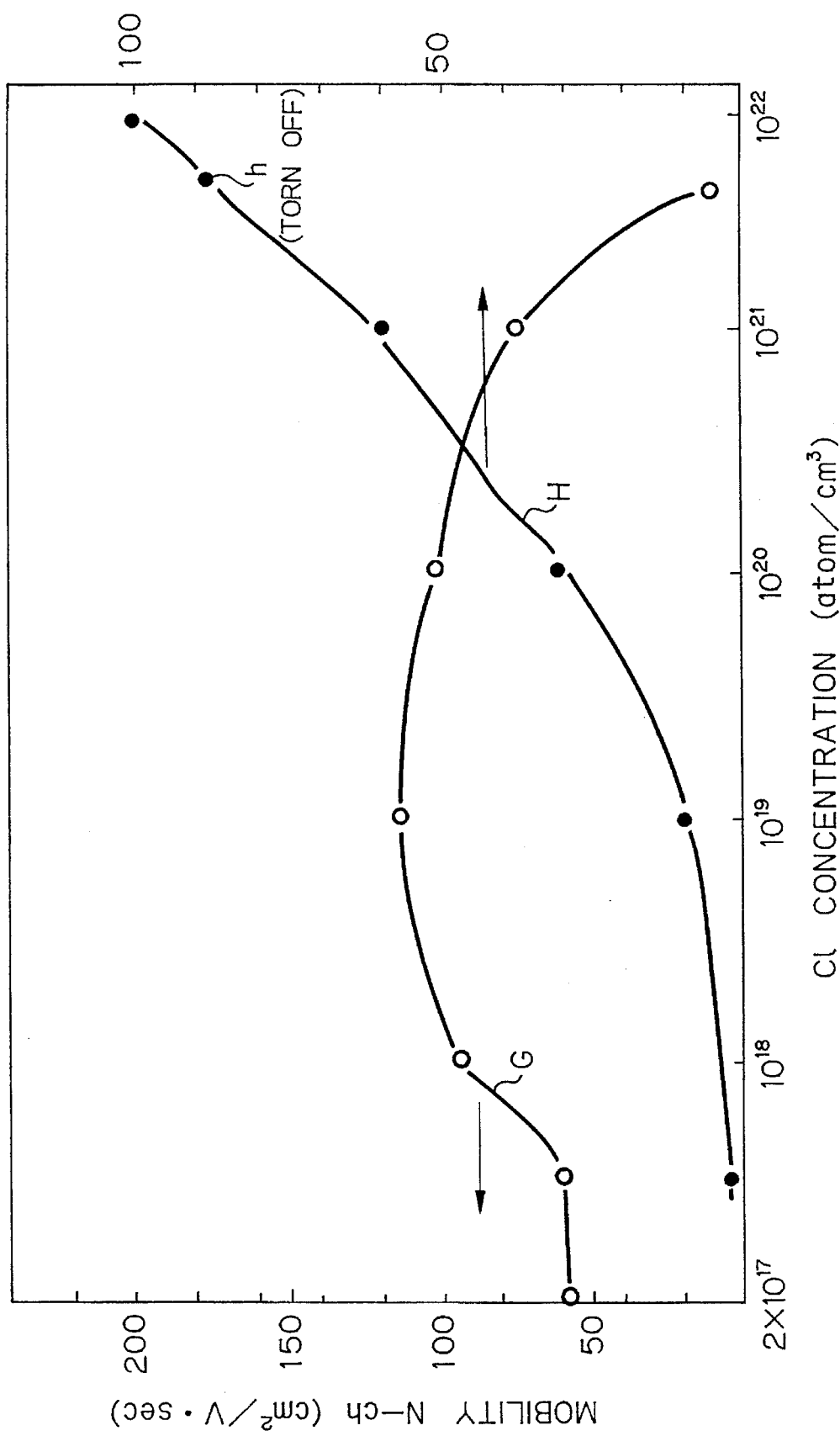
FIG. 6 shows curves comparing flow rate of chlorine and mobility in a semiconductor device.

In FIG. 6, the curve (G) shows the relation between the concentration of chlorine (horizontal axis) in a silicon layer and mobility (vertical axis), and the curve (H) shows the relations between concentration of chlorine (horizontal axis) in a silicon layer and flow rate of chlorine gas. Those curves are obtained in said process (5) at temperature 600° C.

As shown in the curve (G), when concentration of chlorine is low, it does not affect mobility.

As shown at the point (h) of the curve (H), when the concentration of chlorine is too high, the layer is torn off during the solid phase growth process. Further, when said concentration is too high, no solid phase growth occurs. Therefore, it is preferable that the flow rate of the chlorine gas is less than 90 SCCM.

Next, another embodiment of the present invention is described in accordance with FIG. 7, in which an amorphous silicon layer is first processed for solid phase growth to provide an active silicon layer, then, an amorphous silicon layer which includes chlorine is produced on said active silicon layer in a process which is similar to said process (2), and then, said amorphous silicon layer is oxidized to provide a gate insulation layer. That process has the advantage that the temperature when a gate insulation layer is produced is decreased.

The producing steps of the second embodiment are as follows.

(1) A substrate 1 is made of glass, for instance, which can be commercially obtained under the trade name 7059 supplied by Corning Co. Ltd in U.S.A. An insulation layer 2 made of $SiO_2$ is placed on the substrate 1 through a sputter process in a thickness of 1000 Å.

Figure 7A:
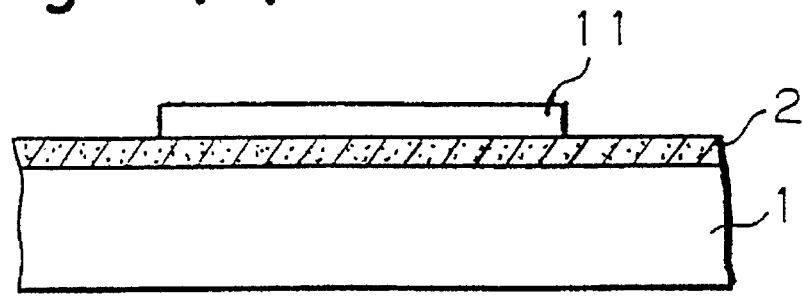
FIG. 7 shows another embodiment of the present invention which is an alternate method of producing a thin film semiconductor device according to the present invention.

An amorphous silicon layer 11 is deposited on said insulation layer 2 in a thickness of about 1000 Å through a LPCVD process (FIG. 7(A)).

The process conditions of said LPCVD process are as follows.

| | |
|---|---|
| $Si_2H_6$ gas | 100–500 SCCM |
| He gas | 500 SCCM |
| Pressure | 0.1–1.0 Torr |
| Temperature | 430–500° C. |

(2) Said amorphous silicon layer 11 is processed for solid phase growth to provide crystallized polysilicon. silicon.

The process conditions for solid phase growth are as follows.

| | |
|---|---|
| $N_2$ gas | 1 SLM |
| Temperature | 600° C. |
| Process time | 5–20 hours |

Figure 7B:
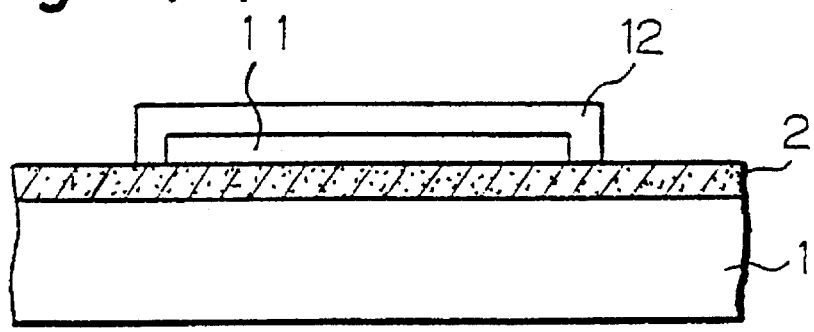

(3) Next, an amorphous silicon layer 12 including chlorine is deposited on said poly silicon layer 11 in a thickness of 1000 Å under the following conditions (FIG. 7(B)).

| | |
|---|---|
| $SiH_4$ gas | 100 SCCM |
| Pressure | 0.3 Torr |
| $Cl_2$ gas | 1–90 SCCM |
| Temperature | 550° C. |
| Growth rate | 100 Å/minute |

Figure 7C:
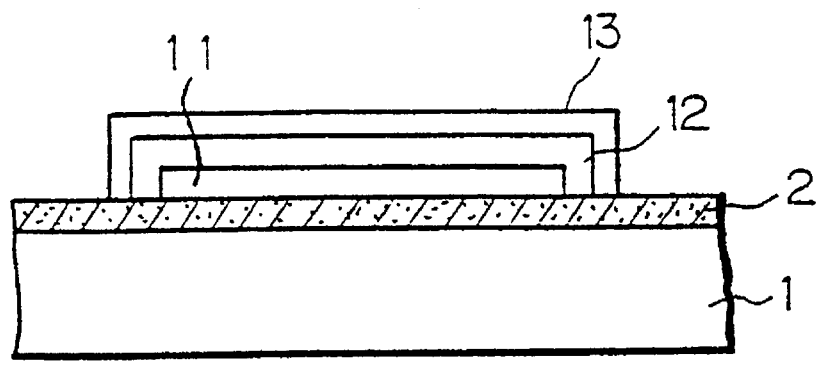

(4) Next, a gate insulation layer 13 is produced by oxidizing the surface of said amorphous silicon layer 12 under the following conditions (FIG. 7(C)).

| | |
|---|---|
| $H_2$ gas | 4 SLM |
| $O_2$ gas | 10 SLM |
| Temperature | 550° C. |
| Process time | 8 hours |

It should be noted that the process temperature of 550° C. is lower than the temperature of 600°0 C. used in the process (4) in the first embodiment.

The following processes are similar to those in the first embodiment, and a thin film transistor (TFT) is obtained.

In the above embodiments, glass is used as a substrate, but quartz crystal can also be used as a substrate. In the present invention, when the concentration of chlorine is less than $1\times10^{17}$ atom/cm$^3$, no improvement of the characteristics of a thin film transistor is obtained. And, when the concentration of chlorine is higher than $5\times10^{21}$ atom/cm$^3$, no solid phase growth is possible and further the formed layer is torn off. Therefore, the preferable range of chlorine in the amorphous silicon layer is from $1\times10^{17}$ atom/cm$^3$ to $5\times10^{21}$ atom/cm$^3$.

As for the concentration of C, 0, and N in the amorphous silicon layer, each must be less than $5\times10^{18}$ atom/cm$^3$, since when it is larger than that figure, a large crystal grain is not obtained.

The application of the present invention is not limited to a thin film transistor, but the present invention may be used in forming a solar battery.

Further, the present invention has the advantage that the producing process may be carried out in a dielectric chamber, for instance, a quartz chamber, which is not in a conductive chamber.

As mentioned above in detail, the present invention provides a silicon layer as an active layer of a thin film transistor by depositing such at a rapid growth rate and low temperature ibr producing a gate insulation layer, and provides a thin film transistor with high mobility, low threshold voltage, high operational reliability, and low producing cost. Further, according to the present invention, high pressure is not required for producing a gate insulation layer, but normal pressure is enough.

From the foregoing, it will now be apparent that a new and improved thin film semiconductor device has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A thin film semiconductor device comprising a substrate, an active layer comprising silicon disposed on said substrate, a gate insulation layer disposed on said active silicon layer, a gate electrode disposed on said gate insulation layer, a source region and a drain region provided in said active silicon layer, and electrodes for eternal connection of said semiconductor device, wherein said active layer comprises chlorine in a concentration of $2\times10^{17}$ atom/cm$^3$ to $5\times10^{21}$ atom/cm$^3$, and wherein the mobility of said active silicon layer is at least 10 cm$^2$/V-Sec.

2. A thin film semiconductor device according to claim 1, wherein the concentration of said chlorine in said gate insulation layer is $2\times10^{17}$ atom/cm$^3$ to $5\times10^{21}$ atom/cm$^3$.

3. A thin film semiconductor as claimed in claim 2 wherein said substrate comprises a glass.

4. A thin film semiconductor as claimed in claim 2 wherein said substrate comprises a glass.

5. A thin film semiconductor according to claim 1 wherein the mobility of said active layer is at least 50 cm$^2$/V-Sec.

6. A thin film semiconductor according to claim 1 wherein said active layer is produced by first disposing a layer comprising amorphous silicon and chlorine on said substrate, and then annealing said amorphous layer under conditions sufficient to convert it to said active layer containing chlorine.

7. A thin film semiconductor as claimed in claim 1 wherein said substrate comprises a glass.

8. A thin film semiconductor as claimed in claim 7 wherein said gate insulating layer is formed by oxidizing said active layer at about 600° C.

9. A thin film semiconductor as claimed in claim 1 wherein said substrate comprises a silicate glass.

* * * * *